United States Patent
Switzer et al.

(10) Patent No.: US 6,812,949 B1
(45) Date of Patent: Nov. 2, 2004

(54) IMAGING APPARATUS AND METHOD FOR EXPOSING A PHOTOSENSITIVE MATERIAL

(75) Inventors: Paul R. Switzer, Batavia, NY (US);
Roger S. Kerr, Brockport, NY (US);
Seung-Ho H. Baek, Pittsford, NY (US);
Wesley H. Bacon, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/640,910

(22) Filed: Aug. 14, 2003

(51) Int. Cl.[7] ............... B41J 2/45; B41J 29/377
(52) U.S. Cl. ........................................... 347/238
(58) Field of Search ........................... 347/238, 223; 257/712, 713; 372/34

(56) References Cited

U.S. PATENT DOCUMENTS

| | | |
|---|---|---|
| 4,339,209 A | 7/1982 | Tanigami |
| 4,440,846 A | 4/1984 | Sanders et al. |
| 6,034,712 A | 3/2000 | Iwasaki |
| 6,683,639 B2 * | 1/2004 | Driessen-Olde Scheper et al. .................. 347/238 |

* cited by examiner

*Primary Examiner*—Huan Tran
(74) *Attorney, Agent, or Firm*—Nelson Adrian Blish

(57) ABSTRACT

An imaging apparatus (10) having a multiple channel image exposure device (12). Improved thermal compensation is achieved by means of mounting an array of light emitting elements (30) on a printed circuit board (28) having at least one thermal via (26) for each light emitting element to thermally control the temperature of the light emitting element. Selected microcapsules (38) within a photosensitive media (44) are exposed with the multiple channel image exposure device to harden the desired microcapsules. Pressure applied to the exposed photosensitive media ruptures the unexposed microcapsule (40), releasing the image-forming material (48) encapsulated within to form an image on the photosensitive media.

14 Claims, 6 Drawing Sheets

IMAGING APPARATUS AND METHOD FOR EXPOSING A PHOTOSENSITIVE MATERIAL

FIELD OF THE INVENTION

The present invention relates in general to the field of image exposure devices and more particularly to an image exposure device having improved thermal compensation for a one-dimensional or two-dimensional array of light emitting elements.

BACKGROUND OF THE INVENTION

Multiple channel image exposure devices having multiple light emitting elements have been used in imaging equipment to expose images on photosensitive media. One such device is described in U.S. Pat. No. 6,034,712, which uses an array of light emitting light elements disposed within recesses formed in a substrate and having a pinhole mask to expose an image on photosensitive media.

The photosensitive media may be of the type having a plurality of microcapsules with an image-forming material encapsulated within the microcapsules. To form an image on a photosensitive media of the type having microcapsules, a multiple channel image exposure device exposes desired microcapsules with at least one of the multiple light emitting elements. Exposure hardens desired microcapsules to a point such that when processed through a microcapsule rupturing device that utilizes pressure, the exposed microcapsules remain intact while the unexposed microcapsules are ruptured, releasing the encapsulated image-forming material to form an image within the photosensitive material. Similar imaging forming equipment is described in U.S. Pat. Nos. 4,440,846 and 4,339,209.

Multiple channel image exposure devices require accurate alignment. Depending on the application and or image resolution, the alignment accuracy may be required to be within a few microns to prevent image artifacts from being generated in an image formed on the photosensitive media due to misalignment of the multiple channel image exposure device. This becomes increasingly important at higher image resolution, and is difficult over a temperature range the device is required to operate at.

Thus, there is a need for improved thermal stability of an array of one-dimensional or two-dimensional multiple light emitting elements of a multiple channel image exposure device to provide longer life of the device, maintain alignment, and improved stability of the output of the light emitting elements.

SUMMARY OF THE INVENTION

Briefly, according to one aspect of the present invention an imaging apparatus for exposing a photosensitive material comprises a lenslet array; an array of light emitting elements in registration with the lenslet array; a printed circuit board having an array of thermal via wherein each of the thermal via is in contact with each of the light emitting elements; a thermal load plate; a thermal electric cooler connected to the thermal load plate; and a heat sink connected to the thermal electric cooler. The thermal load plate is bonded to the printed circuit board with a thermally conductive electrically isolating epoxy.

The present invention is intended to improve the performance of an imaging apparatus that uses a multiple channel imaging device to generate an image on or within a photosensitive media, preferably, but not limited to, a photosensitive media having a plurality of microcapsules, with an image-forming material encapsulated within the microcapsules. When exposed by a multiple channel image exposure device, desired microcapsules become hardened to a point that when processed through a microcapsule rupturing device, unexposed microcapsules are ruptured and release the image-forming material encapsulated within the microcapsules to form an image on or within the photosensitive media. The exposed microcapsules are not ruptured.

The multiple channel image exposure device of the present invention utilizes a molded lenslet array aligned to an array of one-dimensional or two-dimensional multiple light emitting elements to form a multiple channel image exposure device. To improve the output efficiency, increase life, and maintain the alignment of a multiple channel image exposure device, a printed circuit board is used having at least one thermal via to transfer the thermal load from the light emitting elements mounted on one side of the printed circuit board, to a thermal transfer pad on the opposite side of the printed circuit board, to a heat sink. A thermally conductive but electrically isolating epoxy is used between the printed circuit board and the heat sink to allow thermal transfer to, occur, but electrically isolating the printed circuit board from the heat sink. A thermal electric cooler is used to control the thermal transfer from, and to maintain the desired temperature of the light emitting elements. The intent is to maintain alignment of the light emitting elements during operational temperature changes, and to extend the life and maintain control of the output of the light emitting elements.

The invention and its objects and advantages will become more apparent in the detailed description of the preferred embodiment presented below.

BRIEF DESCRIPTION OF THE DRAWINGS

A more complete understanding of the invention and its advantages will become apparent from the detailed description taken in conjunction with the accompanying drawings, wherein examples of the invention are shown, and identical reference numbers have been used, where possible, to designate identical elements that are common to the figures referenced below.

DETAILED DESCRIPTION OF THE INVENTION

The present invention will be directed in particular to elements forming part of, or in cooperation more directly with an apparatus in accordance with the present invention. It is to be understood that elements not specifically shown or described may take various forms well known to those skilled in the art.

Figure 1:
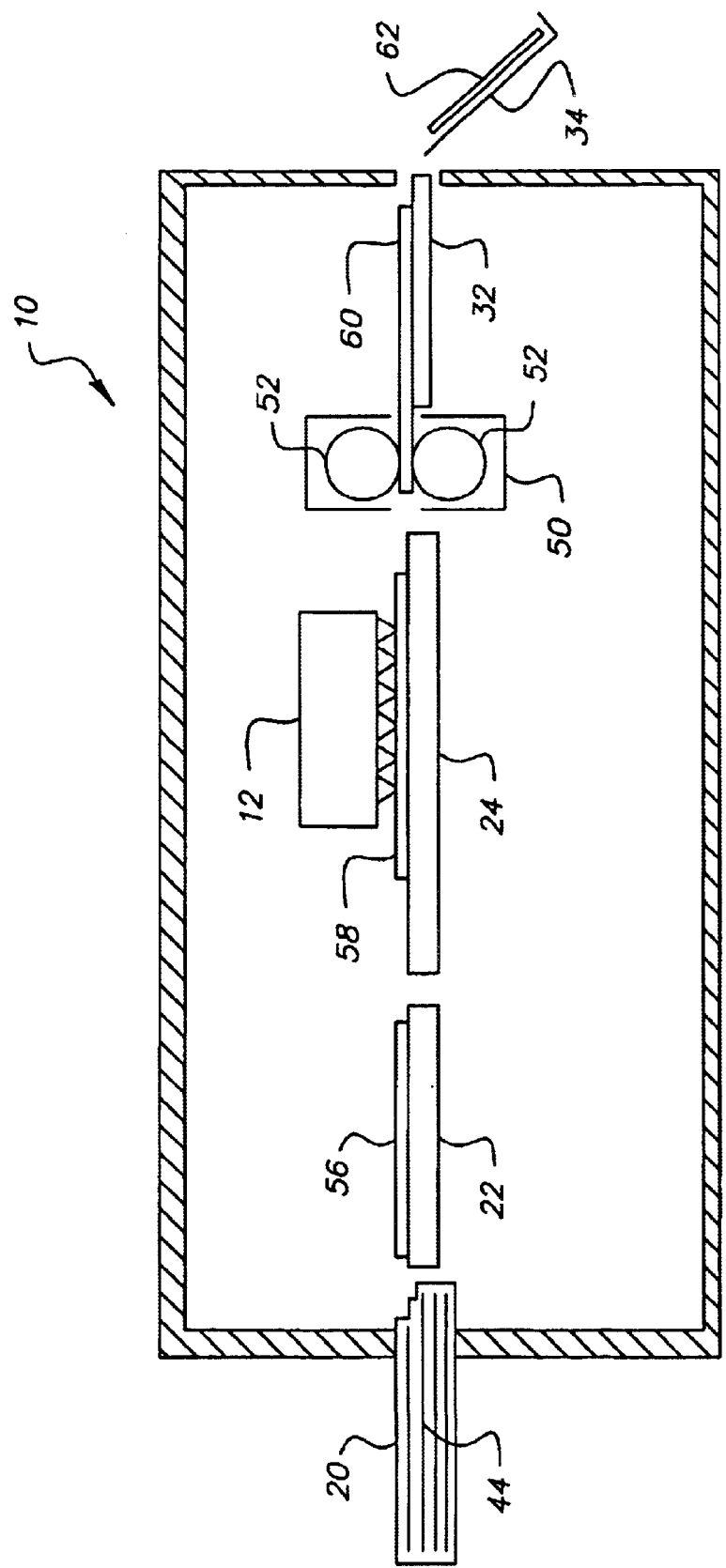
FIG. 1 is a schematic, cross sectional view of an imaging apparatus having a multiple channel image exposure device according to the present invention.

Referring now to FIG. 1 a schematic, cross sectional view of an imaging apparatus 10 for exposing photosensitive media 44 utilizing a multiple channel image exposure device 12 according to the present invention.

Photosensitive media 44 is moved from media tray 20 to the preheat station 22. Once the preheat step is complete the preheated photosensitive media 56 proceeds to the exposure station 24 to be image wise exposed by the multiple channel image exposure device 12. The exposed photosensitive media 58 is then passed through the microcapsule rupturing device 50 where pressure is applied by rupturing rollers 52. The now developed photosensitive media 60 is then passed to the post heating station 32 and from there to the exit tray 34 as a competed image 62.

Figure 2:
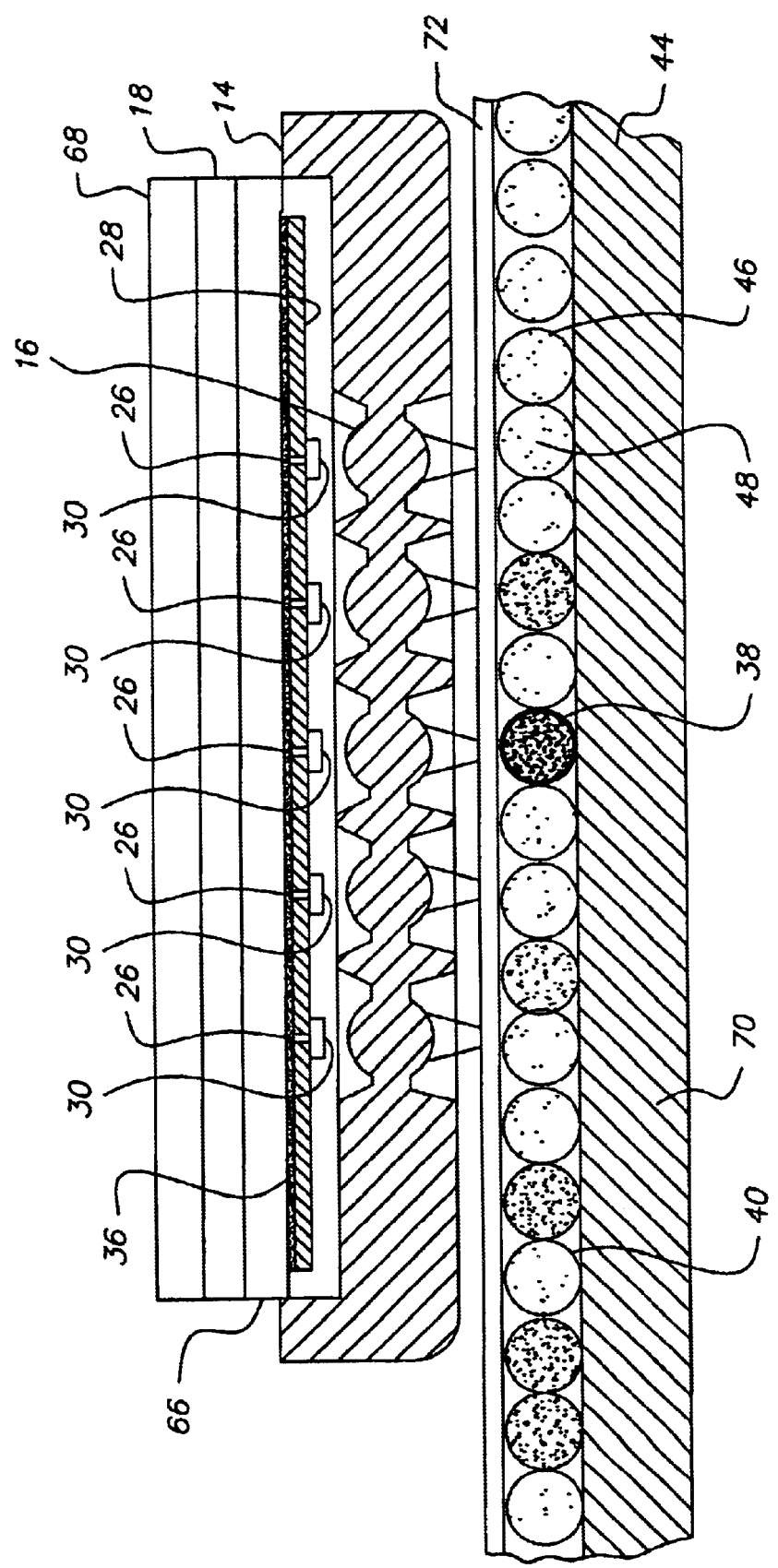
FIG. 2 is a schematic, cross sectional view of a multiple channel image exposure device according to the present invention.

FIG. 2 shows a schematic, cross sectional view of a multiple channel image exposure device 12 shown in FIG. 1. Exposure device 12 has a molded lenslet array 14, which in the preferred embodiment is molded of a polyolefin or other materials well known in the art. The molded lenslet array 14 has an array of molded lenses 16 located a predetermined distance in the z-direction from, and in alignment with, an array of light emitting elements 30 that can be laser diodes or light emitting diodes (LEDs). The light emitting elements 30 are attached by means of soldering, adhesive bonding, or other methods well known in the art, to a printed circuit board 28, which is mounted to a thermal load plate 66 using thermally conductive, electrically isolating epoxy 36.

Printed circuit board 28 has at least one thermal via 26 under each of the light emitting elements 30 to transfer thermal energy from the light emitting elements 30 through the thermal via 26 to the thermal load plate 66. A thermal via is a hole drilled through a printed circuit board. The thermal via may be drilled prior to applying a conductive coat to the circuit board, or it may be drilled after the conductive coat is applied. Typically, the hole is plated after coating with copper or other thermally conductive material. Thermal load plate 66 is attached to thermal electric cooler 18, and monitors the thermal load plate 66, transferring thermal energy to or from heat sink 68 as required.

Photosensitive media 44 is of the type having a plurality of microcapsules 46 with an image-forming material 48 encapsulated within the microcapsules 46 on media support base 70 and having a media overcoat 72. Image wise exposure of the desired microcapsules 46 in photosensitive media 44 is accomplished by a multiple channel image exposure device 12. Exposure hardens the exposed microcapsules 38 to a point such that when processed through a microcapsule rupturing device 50 that utilizes rupturing roller 52 to generate pressure, the device is unable to rupture the exposed microcapsules 38 while rupturing the unexposed microcapsules 40. The ruptured microcapsules release a image-forming material 48 encapsulated within the unexposed microcapsules 40 to form an image within the photosensitive media 44.

The printed circuit board 28 is preferably made of FR-406 or other material well known in the art having a material thickness range of 0.003 to 0.125 inches. The electrical traces 74 on the printed circuit board are made of copper and coated with a wire bondable gold to allow wire bonding of the light emitting elements to the electrical traces.

Figure 3:
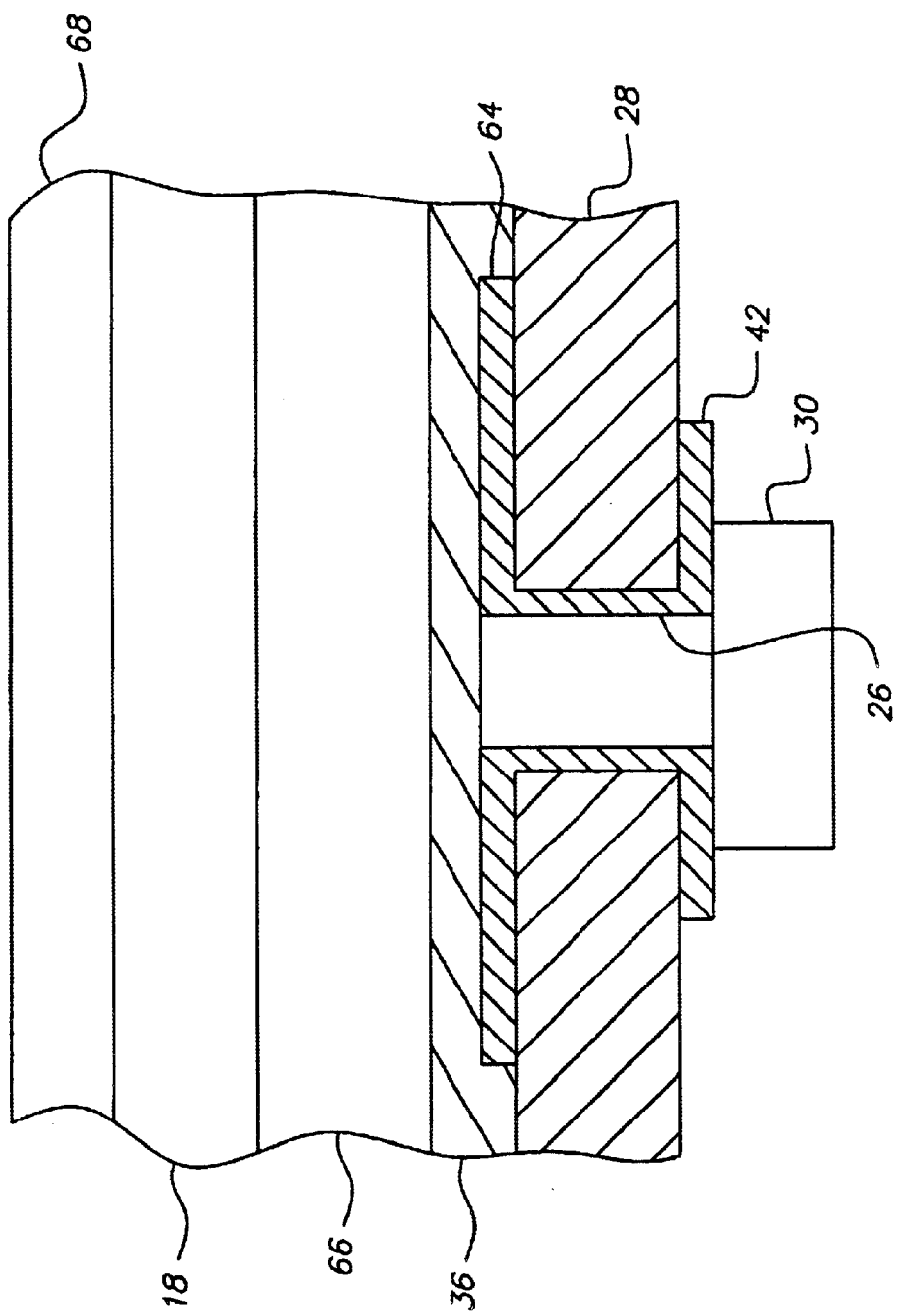
FIG. 3 is a partial, schematic, cross sectional view of a single thermal via according to the present invention.
Figure 4:
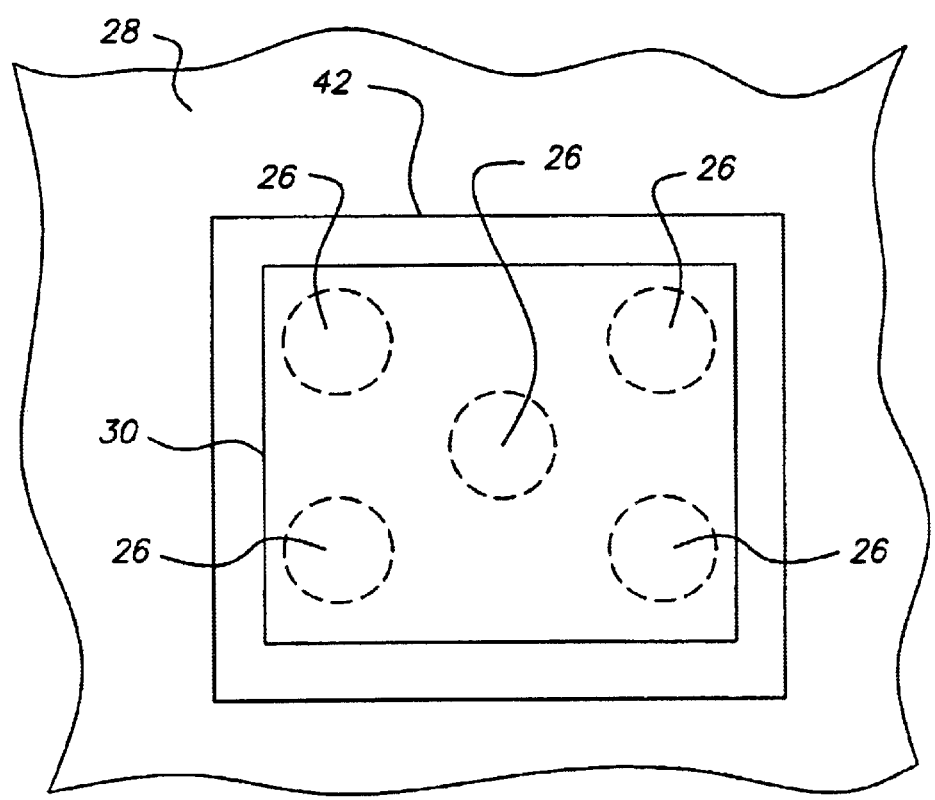
FIG. 4 is a bottom view, partially in phantom, of a light emitting element mounted on a printed circuit board having multiple thermal via according to the present invention.
Figure 5:
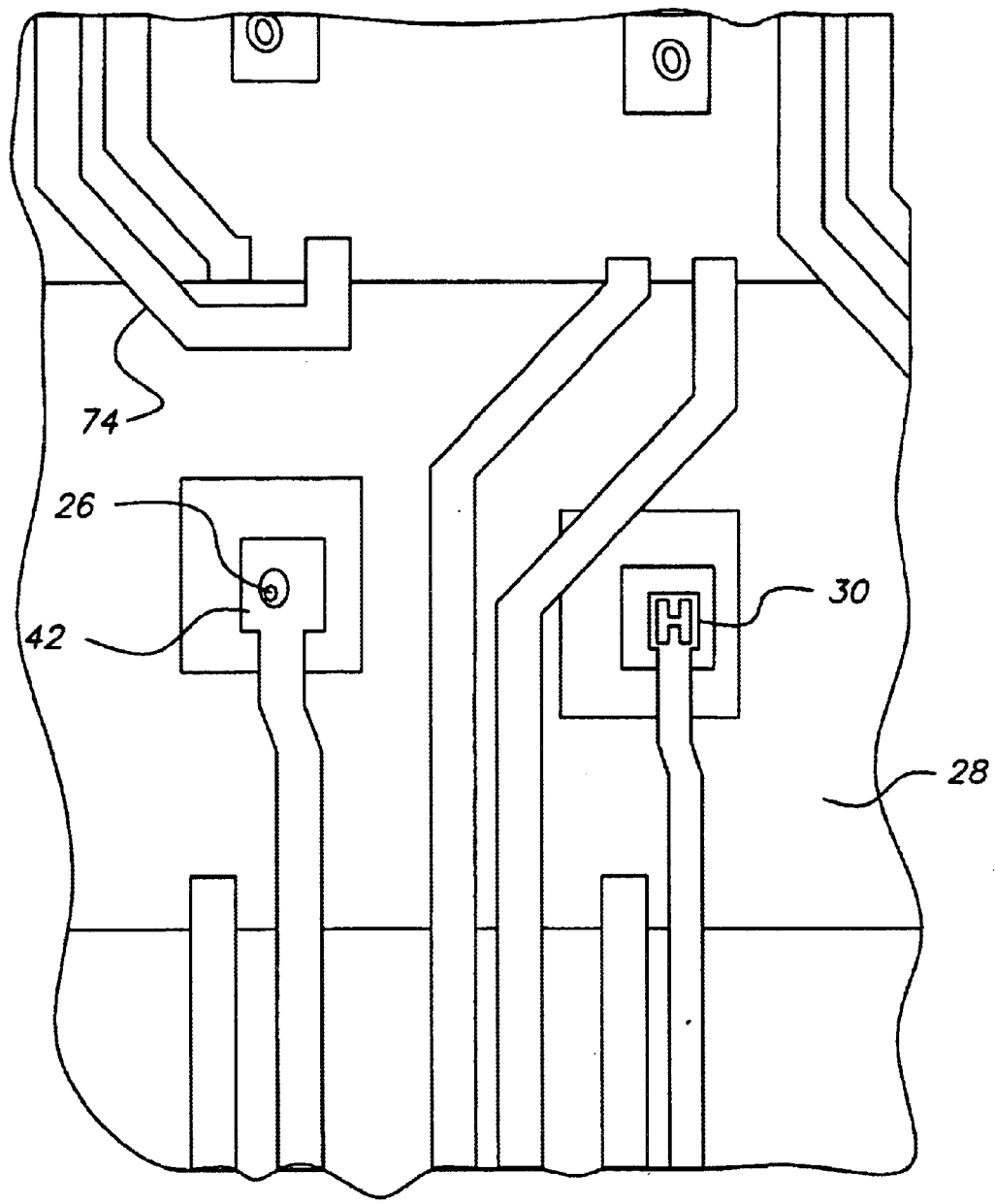
FIG. 5 is a partial perspective view of a printed circuit board having an array of thermal via and a light emitting element according to the present invention.
Figure 6:
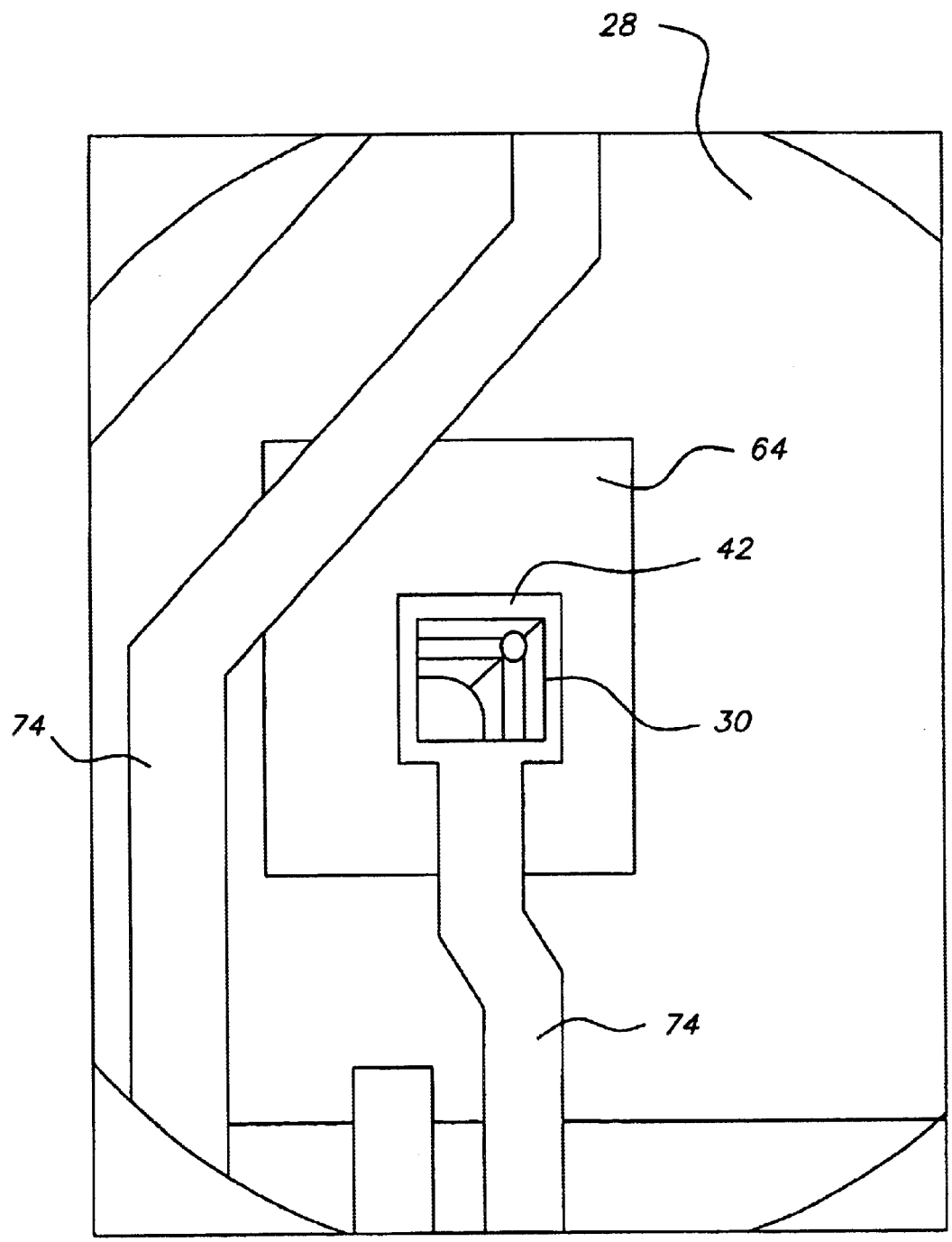
FIG. 6 is a perspective view of a printed circuit board having a single light emitting element according to the present invention.

FIG. 3 shows an enlarged partial schematic cross sectional view of a single thermal via 26, showing a light emitting element 30 mounted over the thermal via. The thermal via allows thermal energy generated by the light emitting element 30 to be transferred from the light source mounting pad 42, to the thermal spreading pad 64, to the thermal load plate 66 that is monitored and controlled by thermal electric cooler 18, which transfers thermal energy from the thermal load plate 66 to heat sink 68 as required or to heat the thermal load plate if required. Heating may be required to warn the light emitting elements 30 to operating temperature. FIG. 4 shows an enlarged, schematic bottom view, partially in phantom, of a single light emitting element 30 mounted over multiple thermal via 26. FIGS. 4 and 5 show partial perspective views of a printed circuit board having an array of thermal via, electrical traces 74, and a light emitting element 30 of the present invention.

The invention has been described in detail with particular reference to certain embodiments thereof, but it will be understood that variations and modifications can be effected within the scope of the invention.

Parts List

10. Imaging apparatus
12. Multiple channel image exposure device
14. Molded lenslet array
16. Molded lens
18. Thermal electric cooler
20. Media tray
22. Preheat station
24. Exposure station
26. Thermal Via
28. Printed circuit board
30. Light emitting element
32. Post heating station
34. Media exit tray
36. Thermally conductive electrically isolating epoxy
38. Exposed microcapsule
40. Unexposed microcapsule
42. Light source mounting pad
44. Photosensitive media
46. Microcapsule
48. Image-forming material
50. Microcapsule rupturing device
52. Rupturing roller
56. Preheated photosensitive media
58. Exposed photosensitive media
60. Developed photosensitive media
62. Completed image
64. Thermal spreading pad
66. Thermal load plate
68. Heat sink
70. Media support base
72. Media overcoat
74. Electrical traces

What is claimed is:

1. An imaging apparatus for exposing a photosensitive material comprising:

a lenslet array;

an array of light emitting elements in registration with said lenslet array;

a printed circuit board having an array of thermal via wherein each of said thermal via is in contact with each of said light emitting elements;

a thermal load plate;

a thermal electric cooler connected to said thermal load plate;

a heat sink connected to said thermal electric cooler; and wherein said thermal load plate is bonded to said printed circuit board with a thermally conductive electrically isolating epoxy.

2. An apparatus as in claim 1 wherein each of said light emitting elements is soldered to said circuit board.

3. An apparatus as in claim 1 wherein each of said light emitting elements is adhesively bonded to said circuit board.

4. An apparatus as in claim 1 wherein said lenslet array is a molded lenslet array.

5. An apparatus as in claim 4 wherein said molded lenslet array is comprised of polyolefin.

6. An apparatus as in claim 1 wherein said light emitting elements are light emitting diodes (LED).

7. An apparatus as in claim 1 wherein said light emitting elements are laser diodes.

8. An imaging apparatus as in claim 1 wherein said photosensitive media comprises a plurality of microcapsules with an image-forming material encapsulated within said microcapsules.

9. An imaging apparatus as in claim 1 wherein each of said light emitting elements are attached to mounting pads on said printed circuit board.

10. An imaging apparatus comprising:

a molded lenslet array;

an array of light emitting elements in registration with said molded lenslet array;

a printed circuit board having an array of thermal via wherein each of said thermal via is in contact with each of said light emitting elements;

wherein said light emitting elements are arranged on a first surface of said printed circuit board;

wherein each of said light emitting elements is attached to at least one thermal via;

wherein each of said thermal via connects said first surface of said printed circuit board with a second surface of said printed circuit board;

a thermally conductive electrically isolating epoxy covering said second surface of said printed circuit board and connecting said printed circuit board with a thermal load plate;

a thermal electric cooler connected to said thermal load plate; and a heat sink connected to said thermal electric cooler.

11. An imaging apparatus as in claim 10 wherein a thermal spreading pad comprises said thermal via.

12. An imaging apparatus as in claim 10 wherein said light emitting elements are mounted on a pad attached to said printed circuit.

13. A method of stabilizing temperature in an imaging apparatus comprising:

providing a lenslet array;

providing an array of light emitting elements in registration with said lenslet array;

providing a printed circuit board having an array of thermal via wherein each of said light emitting elements is in contact with at least one of said thermal via; and wherein each of said thermal via conducts heat away from or transmits heat to each of said light emitting elements through said printed circuit board.

14. A method as in claim 13 comprising:

maintaining a constant temperature at each of said light emitting elements.

* * * * *